(12) United States Patent
Larsen et al.

(10) Patent No.: US 7,869,976 B2
(45) Date of Patent: Jan. 11, 2011

(54) GENERATOR SYSTEM WITH INTELLIGENT PROCESSING OF POSITION SIGNAL

(75) Inventors: Kim Brøndum Larsen, Hadsund (DK); Mogens Lønberg Lau, Silkeborg (DK); Flemming Buus Bendixen, Hobro (DK)

(73) Assignee: Vestas Wind Systems A/S, Randers (DK)

( * ) Notice: Subject to any disclaimer, the term of this patent is extended or adjusted under 35 U.S.C. 154(b) by 3 days.

(21) Appl. No.: 12/317,221

(22) Filed: Dec. 18, 2008

(65) Prior Publication Data

US 2009/0164170 A1 Jun. 25, 2009

(30) Foreign Application Priority Data

Dec. 19, 2007 (DK) ............................... 2007 01826

(51) Int. Cl.
*G06F 15/00* (2006.01)
(52) U.S. Cl. .................. 702/151; 702/94; 702/127; 702/150; 702/152; 702/153; 73/1.79; 700/302
(58) Field of Classification Search .................. 702/94, 702/127, 150–153; 73/1.79; 700/302
See application file for complete search history.

(56) References Cited

U.S. PATENT DOCUMENTS

| 3,895,365 | A | 7/1975 | Freed |
| 5,723,858 | A | 3/1998 | Sugden |
| 7,205,676 | B2 | 4/2007 | Ichinose et al. |
| 2003/0052643 | A1 | 3/2003 | Sweo |
| 2005/0093636 | A1 | 5/2005 | Jasniewicz |
| 2006/0021450 | A1 | 2/2006 | Nallapa |
| 2007/0177314 | A1 | 8/2007 | Weng |
| 2008/0300820 | A1 * | 12/2008 | Hu .............................. 702/147 |

FOREIGN PATENT DOCUMENTS

| DE | 19827261 C1 | 3/2000 |
| EP | 1341311 A2 | 9/2003 |
| WO | WO 02/33358 A1 | 4/2002 |
| WO | WO 2006/094524 A1 | 9/2006 |

OTHER PUBLICATIONS

English language abstract for DE-19827261-C1, "Power Fluctuation Compensation Method for Generator, e.g., of Wind-Power Station," from esp@cenet database.
European Search Report, completed Apr. 15, 2009 & mailed Apr. 27, 2009.
EPO Examination Report, on Application No. 08171178.0-2207, dated Feb. 18, 2010. (This is a corresponding application with similar claims.).

* cited by examiner

*Primary Examiner*—Sujoy K Kundu
(74) *Attorney, Agent, or Firm*—Abelman, Frayne & Schwab

(57) ABSTRACT

An electric power generator system is provided with improved power efficiency due to a reduced sensitivity to errors in the sensing of angular rotor position. The system includes a power generator with a rotor, and a position encoder connected to sense angular position of the rotor and to generate a position signal accordingly. A processor receives the position signal, calculates an angular position in response, calculates an estimated angular position based on earlier received position signals, and finally generates a processed angular position based on the calculated angular position and the estimated angular position. This processed angular position is a more reliable measure of the rotor position, reducing the influence of short-term errors in the position signal, allowing normal wind turbine operation during temporary position encoder failure, and allowing an orderly shutdown during complete position encoder failure.

17 Claims, 3 Drawing Sheets

GENERATOR SYSTEM WITH INTELLIGENT PROCESSING OF POSITION SIGNAL

FIELD OF THE INVENTION

The present invention relates to the field of electric generator systems, such as generator systems for wind turbines. More specifically, the invention relates to a generator system with an intelligent processing of a position signal indicating angular position of the generator rotor.

BACKGROUND OF THE INVENTION

For a wind turbine arranged to generate electric power to an electric grid, power efficiency is a crucial parameter. To provide a high power efficiency the wind turbine must be connected to the electric grid with as few shut down events as possible.

One known source of error causing shut down of the wind turbine is the position sensing or position encoding of the rotor of the power generator. E.g., doubly fed induction type generators require precise sensing of angular position of the generator rotor, e.g., within +/−1°, in order for the control systems to match the electric power signals from the generator to the electric grid for reliable and smooth delivering of electric power to the electric grid. Even short term errors or no position signal can result in emergency shut down of the generator system due to high currents, thereby resulting in poor overall power efficiency of the wind turbine. Further, even minor errors in the position signal can cause unintended voltage peaks from the generator system thus reducing quality in the electric power delivered to the electric grid.

Position sensing devices, often denoted position encoders, are known to eventually produce errors in their output position signals. Further, such devices are often mechanically connected to the shaft of the generator and therefore includes parts running at the speed of the generator shaft, e.g., 1500 rpm or more. Consequently, bearings etc. of the position encoders have a limited lifetime, and therefore early detection of problems with the position encoder is vital with respect to avoid complete damage of the position encoder, which will shut down the wind turbine until the position encoder is replaced.

It is also possible to calculate an angular position of the rotor based solely on the electric output signals from the generator and the electric grid to which the generator delivers power. This eliminates the need for a mechanical position encoder. However, such calculations are complex and require a large amount of processing power. Further, if the voltage is low on the electric grid, then the calculated values are unreliable, and at zero voltage on the electric grid calculation is not possible.

SUMMARY OF THE INVENTION

Thus, according to the above description, one object of the present invention is to provide an electric power generator system capable of providing an improved handling of the position signal received from the position encoder, so as to enable a more reliable operation of the generator system with a reduced amount of shut downs.

In a first aspect, the invention provides an electric power generator system including
- a power generator including a rotor connected to a shaft,
- a position encoder arranged to sense an angular position of the rotor via mechanical connection to the shaft, and to generate a position signal representative of the angular position of the rotor, and
- a processor, preferably a digital signal processing system, arranged
  - to receive the position signal from the position encoder,
  - to provide a calculated angular position of the rotor in response to the position signal,
  - to provide an estimated angular position of the rotor based on earlier received position signals, and
  - to generate a processed angular position from the calculated angular position and the estimated angular position based on at least one predetermined control algorithm.

Since such a generator system provides a processed angular position taking into account both the angular position calculated based on the latest position signal from the position encoder and based on earlier position inputs, such processed angular position will be more reliable than an angular position based on a direct calculation based on one single position signal from the position encoder. Thus, the processed angular position is less vulnerable to errors in the received position signal from the position encoder.

Due to the estimated angular position it is possible to detect errors in the position signal and to some extent also to correct such errors, and even in cases where the position encoder stops to function for a short period, it may be possible to provide a control algorithm such that the processed angular position is sufficiently reliable to maintain normal operation of the power generator system by relying completely on the estimated angular position in such period. More specific ways of calculating and utilizing the estimated angular position to result in a more reliable processed angular position will be described later.

Generator systems, e.g., doubly fed induction type generators, which power generating function depends on a precise knowledge of the rotor position, will be less influenced by errors in the position encoder that may otherwise cause poor electric quality or emergency shut down, and even in case of permanent failure of the position encoder, the system will have time to shut down in a controlled manner without the need for emergency shut down.

According to the above, the generator system according to the first aspect is highly suited for wind turbines and other power generators where reliable operation and high power efficiency are crucial parameters. Periods where the wind turbine stops producing electric power due to position encoder problems can be reduced. Since most modern generator systems include a digital signal processor, the necessary processing of the position signal may be executed completely in software running on such processor. However, the processing or part thereof may also involve analog processing components, if preferred.

In the following, preferred embodiments will be described, especially with respect to the embodiments of the predetermined control algorithm.

The processor may include a correction unit arranged to detect and correct predetermined types of errors in the position signal prior to calculating the angular position, thus performing a pre-filtering of the position signal intended to remove known types of temporal errors in the position signal from the position encoder. Hereby the angular position signal calculated based on the corrected position signal becomes more reliable, and shut down of the generator system due to known types of temporary errors can be avoided. Especially, errors may be corrected based on a pre-stored property of the position encoder, such as its angular resolution, thereby utilizing redundant information in the position signal received from the position encoder. Errors may also be corrected based on a pre-stored property of the power generator, such as its maximum possible angular acceleration, thereby allowing rejection of values in the position signal that appear to reflect an angular acceleration which is not physically possible for the specific generator. Correction of errors in the position signal preferably includes one or more of: 1) removal of a peak which may be caused by electric noise or a "hanging" bit in a digital part of the system, 2) removal of value offset which may be caused by one or more "hanging" bits in a digital part of the system, 3) limitation of angular acceleration exceeding a predetermined value which may be caused by various factors, and 4) compensation of unexpected number of pulses per revolution which may be caused by spurious signals or dropouts.

The processor preferably includes an estimation unit including a Phase Locked Loop (PLL), i.e., including an integrator and a PI regulator such as known in the art, wherein the estimation unit generates the estimated angular position based on earlier angular position inputs. In this way, the PLL is used to filter the input angular position and thus estimates which angular position to expect, thereby allowing an evaluation of the reliability of the angular position value. The processor may be arranged to select to apply the angular position or the estimated angular position as input to the estimation unit, e.g., depending on an evaluation of which one can be considered most reliable.

The predetermined control algorithm may be arranged such that the processed angular position is an output from the PLL, thus providing a reliable measure of the angular position which is filtered by the PLL based on prior angular position inputs. Especially, the estimated angular position may be calculated from the processed angular position by an extrapolation algorithm, such as by assuming a constant angular speed of the rotor, in order to arrive at a good estimate of the angular position one sample ahead.

The processor preferably includes an error handling unit arranged to detect an error based on comparing the angular position and the estimated angular position, and wherein the error handling unit selects to apply the estimated angular position as input to the estimation unit in case an error is detected. If no error is detected, the calculated angular position signal based on the latest position signal input is selected as input to the estimation unit. In a simple embodiment, the error handling unit detects an error in case a difference between the angular position and the estimated angular position exceeds a predetermined value or deviated by more than a certain percentage. However, more complex algorithms or criteria for detecting an error may be used.

In one embodiment, the error handling unit is arranged to select to output the estimated angular position as the processed angular position in case an error is detected. Preferably, the most reliable value one of the calculated and estimated angular position is output as the processed angular position. Thus, in this embodiment the error handling unit is a software switch that outputs either the calculated angular position if no error is detected, while the estimated angular position is output in case an error is detected.

The error handling unit may be arranged to generate an error signal indicating that there is an error in the position encoder. Such error signal may be used to call service personnel who can replace the position encoder, or the error signal may be used by control system to initiate a controlled shut down of the generator system. Especially, the error handling unit may generate the error signal after detecting a predetermined number of errors during a predetermined period of time. Thus, while it is possible to maintain normal operation during a few temporary errors, the error signal may be postponed until a large number of errors have occurred within a limited period of time. Hereby, power efficiency of the generator system is improved while still a safety margin is provided without the need for emergency shut down.

The position encoder may in principle be any type of position encoder, but preferably one delivering an electric position signal. Especially, the encoder may deliver a position signal in the form of a three-wire digital position signal, such as an optical type position encoder delivering a three-wire signal in the form of electric pulses, two wires providing a pulse for each partial revolution of the rotor, and one wire providing a pulse (reset signal) for each full revolution of the rotor. Especially, the position signal may be sampled at a sampling frequency of at least 2 kHz, such as at a sampling frequency of 5 kHz, possibly more than 10 kHz.

The generator system is especially suitable if the power generator is a doubly fed induction generator, since such generator type requires a precise angular position signal indicating the rotor position in order to function properly when connected to an electric grid.

The generator system may further include a control system arranged to receive the processed angular position and to accordingly control at least one of: 1) electric connection of the power generator to an electric grid, and 2) a vibration level of the power generator. In case 1) a reliable operation with a high power efficiency and a high electric quality is obtained due to the reliable processed angular position. In case 2) an efficient and stable attenuation of the vibration level from produced by the generator can be obtained by the precise and reliable processed angular position.

Preferably, processor is arranged to detect an error in the position encoder and to generate an error signal accordingly, and wherein the control system is arranged to initiate a controlled disconnection procedure from the electric grid in response to the error signal. By such error handling, emergency shut downs can be eliminated even by a completely damaged position encoder.

In a second aspect, the invention provides a wind turbine including a power generator system according to the first aspect. The wind turbine is preferably arranged for delivering electric power to an electric grid, and wherein the processed angular position serves to eliminate emergency shut down due to error in the position encoder, such as described in the foregoing for the first aspect.

It is appreciated that the two individual aspects of the invention may each be combined with each other, and that embodiments described for the first aspects apply as well for the second aspect.

BRIEF DESCRIPTION OF THE FIGURES

The invention will now be described in more detail with regard to the accompanying figures of which.

The figures specifically illustrate ways of implementing the present invention and are not to be construed as being limiting to other possible embodiments falling within the scope of the attached claim set.

DETAILED DESCRIPTION OF AN EMBODIMENT

Figure 1:
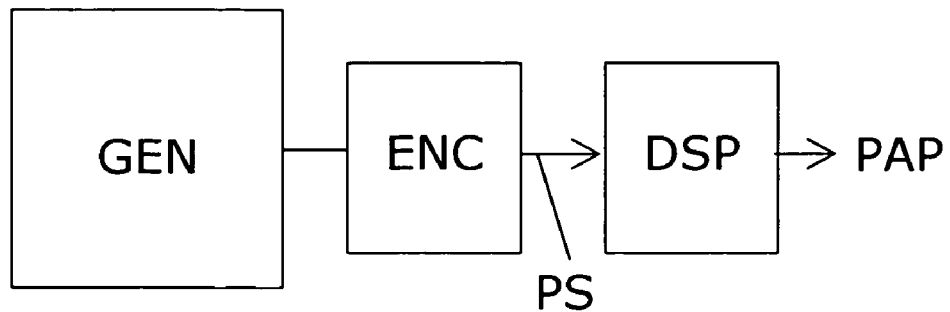
FIG. 1 illustrates basic parts of a power generator system.

FIG. 1 illustrates basic part of a generator system. An electric power generator GEN includes a rotor driven by a shaft. In case of a generator for a wind turbine, the shaft of the generator GEN is driven by blades via a gear box. The generator GEN has a number of phases each producing an electric power signal which can be used to supply electric energy to an electric grid, e.g., the public electric grid. A position encoder ENC is mechanically connected to the generator shaft to sense an angular position of the rotor, which is an important parameter for control of many types of generators, e.g., doubly fed induction generators.

The position encoder ENC is often connected to the shaft via a rather stiff coupling, and thus even a small misalignment of the position encoder ENC relative to the generator shaft may cause wear of the bearings in the position encoder ENC. A typical position encoder ENC is based on optical reading of a disc rotating along with the shaft, the disc being angularly divided into black and white zones, e.g., altogether 1024 zones per full revolution. An optical sensor is used to generate the position signal PS in the form of pulses following the passage of black and white zones.

The position signal PS is then processed by a processor DSP, preferably a digital signal processor DSP, which translates the position signal PS internally into an angular position reflecting the angular position of the generator rotor. In the processor DSP further processing is performed in order to arrive at a more reliable processed angular position PAP, such as will be further described in the following. Especially, such processed angular position PAP can be used in the control of the electrical coupling of the generator GEN to an electric grid and hereby obtain a more reliable operation without the need for shut down in case there are temporary errors in the position signal PS. In case of a complete break down of the position encoder ENC, the processed angular position PAP is based on earlier position signal PS inputs thus allowing normal operation long enough to avoid emergency shut down.

In the following different embodiments of the processor will be described.

Figure 2:
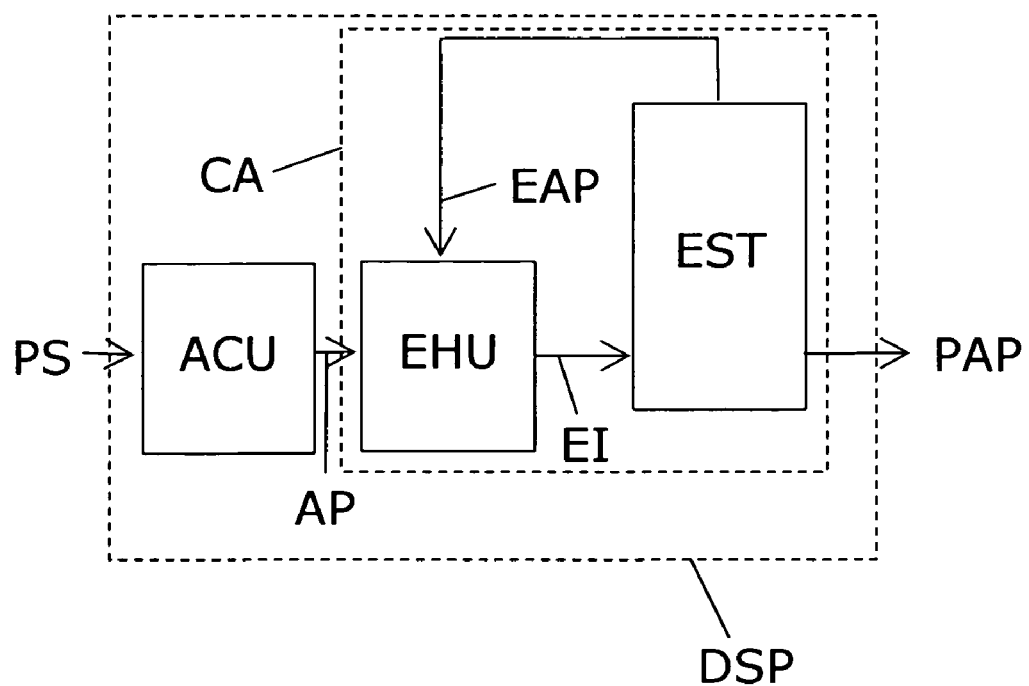
FIG. 2 illustrates one processor embodiment.

FIG. 2 illustrates an embodiment of a processor DSP according to the invention. The position signal PS from the position encoder is received in the processor DSP, and the position signal PS is input to an angular position calculation unit ACU that calculates an angular position AP accordingly. It is appreciated that this calculation of angular position AP will depend highly on the type of position signal PS. However in case the position signal PS is in the form of a number of pulses per full revolution, the ACU will include a counter that counts the pulses up to a known number of pulses per full revolution, and then the counted number of pulses can be translated directly into an angular position AP in the range 0° to 360° or similar angular representation. Preferably the position signal PS includes a reset signal in the form of one pulse per full revolution which enables a correct angular offset corresponding to the precise angular position of the generator rotor.

The calculated angular position AP is then applied as input to a predetermined control algorithm CA which includes an error handling unit EHU. The error handling unit EHU compares the calculated angular position AP with an estimated angular position EAP received from an estimation unit EST which includes an algorithm arranged to predict the next sample value, i.e., the next expected angular position preferably taking into account several earlier input samples, thus resulting in a reliable estimated angular position.

The error handling unit EHU decides from this comparison which one of the calculated angular position AP and the estimated angular position EAP is considered as the most reliable, and the most reliable one of the two is then output as input EI to the estimation unit EST. This comparison is preferably performed sample by sample, and the selection can be based on calculating a simple difference between the AP and EAP values. If this difference exceeds a certain predetermined value or percentage, then it is decided to provide the estimated angular position EAP as input EI to the estimation unit EST, since a large deviation can be considered as caused by an erroneous position signal PS. This procedure ensures that only the most reliable values are put forward in the estimation unit EST, thereby increasing the quality of the estimated angular position EAP. In the illustrated embodiment, the output from the predetermined control algorithm CA and thereby the final output from the processor DSP, namely the processed angular position PAP is also generated by the estimation unit EST, as will be explained in more details in connection with the embodiment illustrated in FIG. 4.

Figure 3:
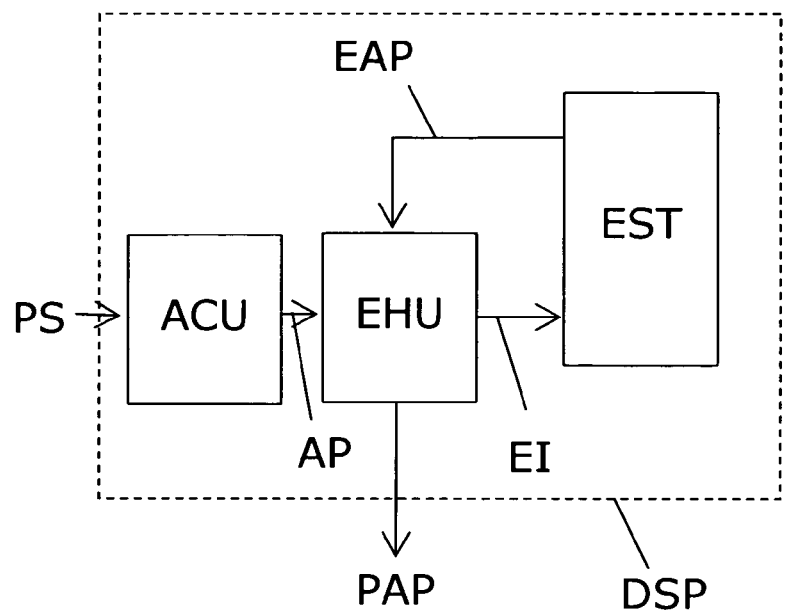
FIG. 3 illustrates another processor embodiment.

FIG. 3 illustrates another processor DSP embodiment. It differs from the embodiment of FIG. 2 only with respect to the error handling unit EHU and estimation unit EST. In FIG. 3 the error handling unit EHU not only decides which on AP and EAP to provide as input EI to the estimation unit EST, such as explained above. The error handling unit EHU also outputs the processed angular position PAP, namely as the one of the AP and EAP that is considered most reliable. In case the error handling unit EHU decides that the AP must be erroneous, then the EAP is output as the processed angular position PAP, while in case there is no error detected, then the AP is output as the processed angular position PAP.

Figure 4:
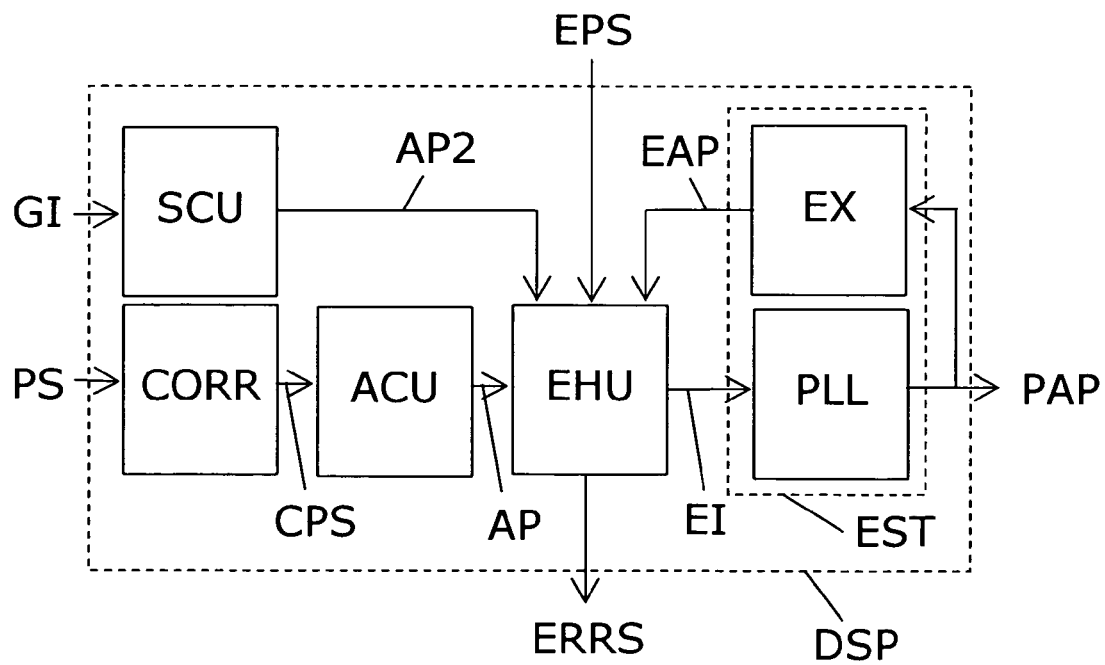
FIG. 4 illustrates a third processor embodiment.

FIG. 4 illustrates yet another processor DSP embodiment. Compared to the embodiment of FIG. 2, a pre-filter or correction unit CORR is included prior to the angular calculation unit ACU. This correction unit CORR generates a corrected CPS in response to the position signal. The correction unit CORR may analyze the position signal PS with respect to detect a number of different types of errors that are likely to occur temporarily, i.e., in a single sample or in a few subsequent samples, and thus to be able to detect an error, a number of subsequent samples must be taken into account. In case an error is observed for a long period of time, the correction unit CORR is preferably arranged to generate an error signal which can be used to call service personnel and/or shut down the generator system in a controlled manner. However, temporary errors are preferably only detected and corrected such that normal operation can be maintained. Examples of errors that can be detected will be explained later with reference to FIG. 5.

In FIG. 4 the role of the error handling unit EHU corresponds to that explained in relation to FIG. 2, however in this embodiment the error handling unit EHU can generate an error signal ERRS if an error in the angular position AP signal is detected. This error signal ERRS can be used to shut down the generator system in a controlled manner, while the error handling unit EHU selects to permanently provide the EAP as input EI to the estimation unit EST, thus serving to provide a processed angular position PAP of an acceptable quality long enough to ensure proper operation during a controlled shut down.

Furthermore, compared to FIG. 2, the error handling unit EHU of FIG. 4 has two extra inputs, namely: 1) an extra position signal EPS from a second position encoder device connected to sense the angular position of the generator rotor, and 2) an electric input from the generator GI which is taken as input to a sensor less calculation unit SCU to calculate yet another angular position AP2 based solely on the electric input GI from the generator, i.e., without any mechanical position sensor involved. This is known in the art.

These redundant angular position data AP2, EPS can be used by the error handling unit EHU to support the angular position AP based on the primary position encoder, in case this primary position encoder fails, e.g., in case of its break down. This helps to allow normal operation until the primary position encoder has been replaced. The error handling unit will in such case generate an error signal ERRS, but operation may safely be maintained and thus the generator system can maintain power generation until the primary position encoder is replaced. To reduce computational power requirements in the processor DSP, it may be preferred that the sensor less calculation unit SCU is only active in case an error is detected in the angular position AP based on the primary position encoder. The same applies to the extra calculations needed to take into account the position signal EPS from the extra position encoder.

In FIG. 4 the estimation unit EST includes a Phase Locked Loop PLL that receives the input EI and further generates the processed angular position PAP in response to sequence of inputs EI, thereby providing a filtered processed angular position PAP that is considerably more reliable than the directly calculated angular position AP. It is appreciated that the design of the PLL includes a number of variables, e.g., its bandwidth, and these variable can be selected by the skilled person so as to suit the specific properties of generator, position encoder etc. Further, the choice of these variables will depend on the use of the output angular position. Thus, the processor DSP may include two or more PLLs serving to output respective estimated or processed angular positions PAP which are suited for respective different purposes, e.g., such plurality of PLLs may have different bandwidths.

Figure 5:
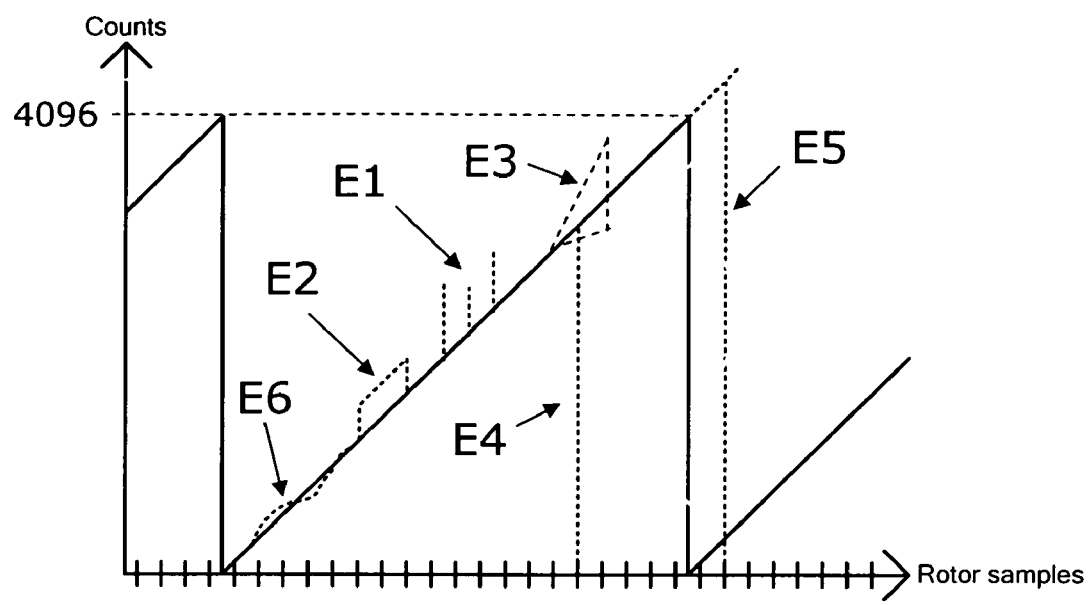
FIG. 5 illustrates possible errors in a position signal from a position encoder.

FIG. 5 illustrates for a specific type of position encoder some typical errors in its position signal which can be detected and corrected upon detection in the correction unit CORR, as explained in relation to the embodiment of FIG. 4. FIG. 5 illustrates the counting of pulses in the position signal PS for each one of the 4096 received per full 360° revolution of the rotor shaft. The position encoder is further expected to provide one reset pulse for each revolution of the rotor shaft.

One type of error is spurious peaks or spikes E1 in the position signal PS, e.g., of a duration of one sample which may be caused by "hanging" bits in a preceding digital circuit, or caused by electric noise etc. The correction unit CORR preferably detects such peaks E1 by comparing the sample value with foregoing sample values, and if the current sample value exceeds a predetermined change, then the current sample value is detected as a peak E1, and the value can be disregarded or corrected, i.e., the sample value being detected as a peak can be corrected to a value expected from the foregoing values.

Another type of error is value offset E2 which is a number of subsequent samples with an elevated (or lowered) value compared to what would be expected, such as affected by one or more "hanging" bits in a preceding digital circuit, e.g., in a digital output circuit of the position encoder. A large offset can easily be detected and corrected by the correction unit CORR, but in case of a small offset, it may not be able to detect by the correction unit CORR. However, in that case the influence of the offset E2 will at least be suppressed by the loop including the estimation unit EST.

An acceleration exceeding that possible for the specific generator E3 can be detected by calculating, e.g., over a number of samples, an angular acceleration value and compare this calculation result with a pre-stored value corresponding to the maximum angular acceleration which can occur for the rotor of the specific generator. If the calculated angular acceleration exceeds this value, it must be due to an error in the position signal. E.g., such acceleration exceeding the maximum possible angular acceleration of the rotor E3 may be corrected by correcting values in a number of samples to the maximum possible angular acceleration of the rotor. This may still not be a complete correction, but at least it will be closer to the true value since a physical limitation is taken into account. A remaining error will then be reduced by the loop including the estimation unit EST.

Error E4 indicates a reset signal received before expected. This can be detected if the counter has reached, e.g., only 3000 out of expected 4096, the reset signal must be a spurious signal and thus should be disregarded, since it can be decided that reset signals are accepted only within +/− one sample from the expected maximum number of pulses.

Error E5 is the opposite of error E4, namely a missing reset signal or a reset signal arriving too late, i.e., after the expected maximum number of pulses (e.g. 4096 as illustrated) has been received. This error can be remedied, since at the latest the counter is reset one sample after the expected maximum number of pulses has been detected, in case the reset signal is not received. If the reset signal is not at all received after several such corrections, the correction unit may generate an error signal indicating that the position encoder is damaged, since either too many pulses are received by error, or the reset signal is erroneously not received.

By selection of proper algorithms these errors E1, E2, E3, E4, E5 can be detected and also corrected already in the pre-filtering or correction unit CORR. If an error is not detected or not properly corrected in the correction unit CORR, it will result in a deviating angular position AP that will most likely be detected as an error in the error handling unit EHU and/or at least filtered in the estimation unit EST such that the processed angular position PAP will not suffer severely from a single or a few erroneous samples.

Error E6 illustrates an erroneous filtering of the true angular rotor position which may be due to the position encoder being slightly eccentrically mounted to the rotor shaft and thus outputs a position signal that does not precisely reflect the true rotor position. The erroneous filtering E6 may also be due to an oscillation or vibration between a rotary part of the position encoder and the housing of the position encoder, which will result in a position signal which will not precisely follow the true rotor position but the position signal will be modulated by such oscillation/vibration. Such filtering error E6 may not be possible to detect and correct in the correction unit CORR, but such error E6 will be eliminated or at least suppressed in the loop including the estimation unit EST, and thus the error E6 will not significantly influence the processed angular position PAP.

Figure 6:
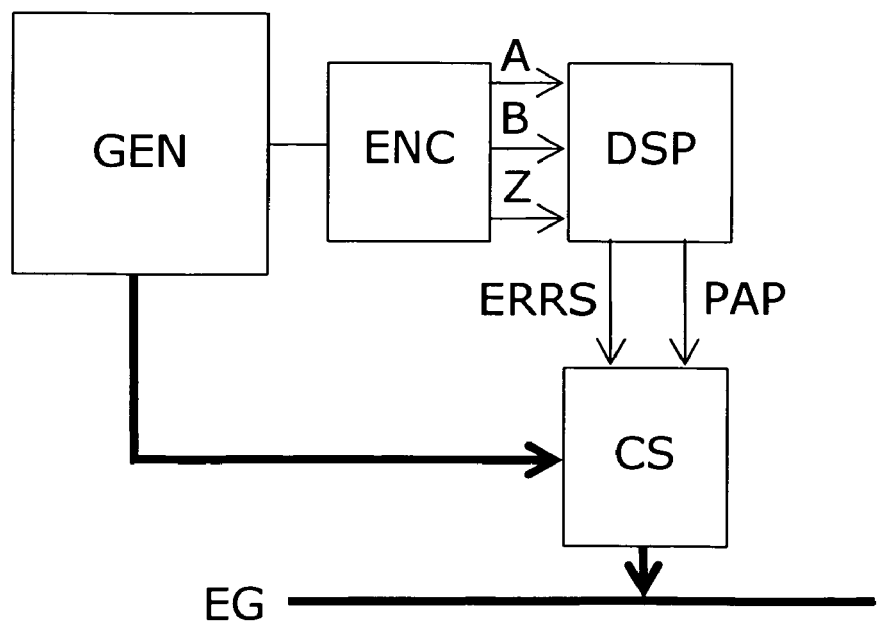
FIG. 6 illustrates a generator system connected to an electric grid.

FIG. 6 illustrates a generator system connected to an electric grid EG, e.g., a wind turbine generator system. A position encoder ENC is connected to the generator GEN, e.g., a doubly fed induction generator, to sense an angular position of its rotor. The position encoder ENC generates three signals in response: a first pulse signal A once for each angular resolution, a second pulse signal B corresponding to the first pulse signal B but offset in time, and a reset signal Z in the form of one pulse per full 360° revolution. These signals A, B, Z are received by the processor DSP that generates a processed angular position PAP in response, such as explained above. Further, the processor DSP is arranged to generate an error signal ERRS in case a fault in the position encoder ENC is detected, such as also described above. A control system CS handles matching of the electric power from the generator GEN to the electric grid EG. To do so, the control system CS receives the processed angular position PAP, and the control system is arranged to receive the error signal ERRS to be able to initiate a controlled shut down in response. In case of a wind turbine, it is possible to perform a controlled shut down in less than one second.

The precise error handling strategy to be followed depends on a number of factors in the specific setup, however with the processed angular position PAP as explained above, a generator system will have improved possibilities of maintaining normal operation. At least the generator system will have sufficient time to perform a controlled shut down, in case the position encoder ENC fails.

To sum up, the invention provides an electric power generator system is provided with improved power efficiency due to a reduced sensitivity to errors in the sensing of angular rotor position. The system includes a power generator with a rotor, and a position encoder connected to sense angular position of the rotor and to generate a position signal accordingly. A processor receives the position signal, calculates an angular position in response, calculates an estimated angular position based on earlier received position signals, and finally generates a processed angular position based on the calculated angular position and the estimated angular position. This processed angular position is a more reliable measure of the rotor position since it is based on earlier position inputs, preferably several earlier inputs. This provides a high immunity to short term errors in the position signal, and for, e.g., wind turbines this means that normal operation can be maintained in situations where the position encoder temporarily fails, and in case of complete failure, operation can be maintained long enough to avoid emergency shut down. In preferred embodiments, the processor is arranged to pre-filter the position signal, i.e., detect and correct prior to calculating the angular position. It preferably also includes an error handling based on comparing the estimated angular position with the calculated angular position and thereby determines an input to a Phase Locked Loop based estimator that is also used to provide the processed angular position.

Although the present invention has been described in connection with the specified embodiments, it should not be construed as being in any way limited to the presented examples. The scope of the present invention is to be interpreted in the light of the accompanying claim set. In the context of the claims, the terms "including" or "includes" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

We claim:

1. An electric power generator system including:
   a power generator including a rotor connected to a shaft,
   a position encoder arranged to sense an angular position of the rotor via mechanical connection to the shaft, and to generate a position signal representative of the angular position of the rotor, and
   a processor arranged
   to receive the position signal from the position encoder,
   to provide a calculated angular position of the rotor in response to the position signal,
   to provide an estimated angular position of the rotor based on earlier received position signals, and
   to generate a processed angular position from the calculated angular position and the estimated angular position based on at least one predetermined control algorithm,
   further including a control system arranged to receive the processed angular position and to accordingly control at least one of: an electric connection of the power generator to an electric grid, and a vibration level of the power generator.

2. The system according to claim 1, wherein the processor is arranged to detect an error in the position encoder and to generate an error signal accordingly, and wherein the control system is arranged to initiate a controlled disconnection procedure from the electric grid in response to the error signal.

3. The system according to claim 1, wherein the processor includes a correction unit arranged to detect and correct predetermined types of errors in the position signal prior to calculating the angular position.

4. The system according to claim 3, wherein the processor is arranged to correct the position signal based on a pre-stored property of the position encoder, such as its angular resolution.

5. The system according to claim 3, wherein the processor is arranged to correct the position signal based on a pre-stored property of the power generator, such as its maximum possible angular acceleration.

6. The system according to claim 3, wherein the correction of errors in the position signal includes at least one of: removal of a peak, removal of value offset, limitation of angular acceleration exceeding a predetermined value, and compensation of unexpected number of pulses per revolution.

7. The system according to claim 1, wherein the processor includes an estimation unit including a Phase Locked Loop, wherein the estimation unit generates the estimated angular position based on earlier angular position inputs.

8. The system according to claim 7, wherein the processor is arranged to select to apply the angular position or the estimated angular position as input to the estimation unit.

9. The system according to claim 7, wherein the processed angular position is an output from the Phase Locked Loop.

10. The system according to claim 9, wherein the estimated angular position is calculated from the processed angular position by an extrapolation algorithm, such as by assuming a constant angular speed of the rotor.

11. The system according to claim 7, wherein the processor includes an error handling unit arranged to detect an error based on comparing the angular position and the estimated angular position, and wherein the error handling unit selects to apply the estimated angular position as input to the estimation unit in case an error is detected.

12. The system according to claim 11, wherein the error handling unit is arranged to detect an error in case a difference between the angular position and the estimated angular position exceeds a predetermined value.

13. The system according to claim 11, wherein the error handling unit is arranged to select to output the estimated angular position as the processed angular position in case an error is detected.

14. The system according to claim 11, wherein the error handling unit is arranged to generate an error signal, indicating that there is an error in the position encoder, such as to generate the error signal after detecting a predetermined number of errors during a predetermined period of time.

15. The system according to claim 1, wherein the position signal generated by the position encoder is a three-wire digital position signal, such as the position signal being sampled at a sampling frequency of at least 2 kHz, such as at a sampling frequency of 5 kHz.

16. The system according to claim 1, wherein the power generator is a doubly fed induction generator.

17. A wind turbine for delivering electric power to an electric grid, wherein the wind turbine includes a power generator system that comprises:
 a power generator including a rotor connected to a shaft;
 a position encoder arranged to sense an angular position of the rotor via mechanical connection to the shaft, and to generate a position signal representative of the angular position of the rotor;
 a processor arranged
  to receive the position signal from the position encoder,
  to provide a calculated angular position of the rotor in response to the position signal,
  to provide an estimated angular position of the rotor based on earlier received position signals, and
  to generate a processed angular position from the calculated angular position and the estimated angular position based on at least one predetermined control algorithm;
 wherein the processed angular position serves to eliminate emergency shut down due to error in the position encoder; and
  further including a control system arranged to receive the processed angular position and to accordingly control at least one of: electric connection of the power generator to an electric grid, and a vibration level of the power generator.

* * * * *